(12) United States Patent
Tousson

(10) Patent No.: US 6,250,085 B1
(45) Date of Patent: Jun. 26, 2001

(54) TEMPERATURE SELF-REGULATED INTEGRATED CIRCUITS AND DEVICES

(76) Inventor: Eliahou Tousson, 13843 Oxnard St. #54, Van Nuys, CA (US) 91401

( * ) Notice: Subject to any disclaimer, the term of this patent is extended or adjusted under 35 U.S.C. 154(b) by 0 days.

(21) Appl. No.: 09/320,005

(22) Filed: May 26, 1999

(51) Int. Cl.$^7$ .................................................. F25D 21/02
(52) U.S. Cl. ............................................ 62/3.7; 62/259.2
(58) Field of Search .................... 62/3.7, 259.2, 62/3.2

(56) References Cited

U.S. PATENT DOCUMENTS

| | | | |
|---|---|---|---|
| 5,457,342 | * 10/1995 | Herbst, II | 257/712 |
| 5,480,840 | * 1/1996 | Barnes et al. | 437/209 |
| 5,522,225 | * 6/1996 | Eskandrari | 62/3.7 |
| 5,572,407 | * 11/1996 | Sobhani | 361/719 |
| 5,637,921 | * 6/1997 | Burward-Hoy | 257/712 |
| 5,956,569 | * 9/1999 | Shiu et al. | 438/48 |
| 6,054,676 | * 1/2001 | Wall et al. | 219/209 |
| 6,055,814 | * 5/2000 | Song | 62/3.2 |
| 6,094,919 | * 8/2000 | Bhatia | 62/3.7 |
| 6,112,525 | * 9/2000 | Yoshida et al. | 62/3.7 |
| 6,125,635 | * 10/2000 | Nomura et al. | 62/3.2 |
| 6,163,161 | * 12/2000 | Neeb | 324/760 |
| 6,173,576 | * 1/2001 | Ishida et al. | 62/3.7 |

FOREIGN PATENT DOCUMENTS 4-309770 * 11/1992 (JP) ..................................... 62/259.2

* cited by examiner

Primary Examiner—William Doerrler
Assistant Examiner—Melvin Jones
(74) Attorney, Agent, or Firm—Herbert M. Shapiro

(57) ABSTRACT

Thermoelectric coolers are distributed within a semiconductor or an optical chip at anticipated hot spots. Each cooler is responsive to normal operating conditions or to signals from a heat sensor to remove heat from the associated hot spot. In an alternative embodiment, a cooler is placed within the semiconductor package rather than being defined within the chip itself. The closer the cooler to the hot spot, the more efficient the heat removal. As smaller and smaller line width technology leads to denser and denser circuitry, heat removal, already an operation-limiting consideration, will become an increasingly significant issue.

11 Claims, 4 Drawing Sheets

TEMPERATURE SELF-REGULATED INTEGRATED CIRCUITS AND DEVICES

FIELD OF THE INVENTION

This invention relates to semiconductor and optical integrated circuits and more particularly to apparatus operative to cool hot spots in such circuits controllably.

BACKGROUND OF THE INVENTION

Integrated circuits such as microprocessors are commercially available as is well known. It is also well known that such circuits develop hot spots during operation and the removal of heat so generates is a significant constraint on the operation of such circuits. The problem of heat removal is exacerbated by the technological advance to increasingly higher speeds and to smaller and smaller feature size and the resulting increase in the number of components in chips in which such circuits are defined.

BRIEF DESCRIPTION OF THE INVENTION

In accordance with the principles of this invention, Thermoelectric coolers such as Peltier coolers are formed within a chip in which components are defined in an integrated circuit (IC). The coolers are defined to couple to circuit hot spots and to move heat, generated at the hot spots, to cooler areas of the chip or to a heat sink. In this manner, critical hot spots in a circuit, which may otherwise lead to circuit failures, are controlled in a manner to distribute the heat or at least to remove heat from a failure prone critical area. The Peltier cooler in each instance may be operative responsive to normal system power and signal pulses or may be responsive to sensors which control the Peltier cooler when temperature in excess of a preset limit is sensed.

In another embodiment, a Peltier cooler for an entire chip or cooler for different chip segments may be packaged along with a chip. The closer the position of the cooler to a heat spot, the more efficient the heat removal.

The Peltier effect is a thermoelectric effect. If an electric current is passed through the junction of two materials, then heat will be generated or absorbed, depending on the direction of the electric current.

A Peltier cooler is not a new concept as such, but the use of the Peltier effect inside an IC, either within the IC package or as a part of the chip itself, is considered a significant advance over the prior art. Specifically, in accordance with this invention a Solid State cooling system is included inside every IC, as a part of the construction of the IC itself, either within the IC package or as a part of the chip itself.

By adding to the Peltier cooler (heater) a feedback circuit which measures the chip temperature, regulation of the temperature can be provided. The proximity between the chip and the cooler allows much better regulation of the temperature than with conventional cooling. Also, the reversibility of the Peltier effect (the cooler becomes a heater and vice versa, depending on the direction of the electric current) allows even better temperature regulation and maintaining it over a larger range of outside temperatures.

Some of the advantages of the temperature self-regulated ICs and devices include: temperature stability, lower operating temperature, operating over a larger range of outside temperature, isothermal environment, frequency stability, reduced size, increased speed and longer life.

Some of the applications and the related current problems (in parentheses) are listed below:

1. Precision ICs and devices. (Amplifier input errors; Johnson noise).
2. Hall effect and magnetic-resistance ICs and devices. (Thermoelectric and thermomagnetic contributions due to temperature gradients; Johnson noise; Temperature coefficient of resistively, specially for magnetoresistive devices).
3. Very stable crystal oscillators. (Temperature dependence of frequency).
4. High-power Ics and devices. (Size; Life duration).
5. High speed CMOS logic circuits. (Leakage currents dominates quiescent power dissipation; Carrier mobility dominates transistors gain and therefore the speed).
6. New designed and packaged high-density ICs with regard to optimizing size and speed parameters. (Heat dissipation).
7. Small size and high speed computers.

It is well known that the speed of computers is limited by the size of the computer, because the electric pulses need finite time to travel inside the computer. Circuit density in a computer is limited by heat sinking problems of the heat that is generated by the computer parts. Moreover, high speed components generate more heat. Temperature Self-Regulated Integrated Circuits (ICs) in accordance with this invention is proposed herein as the solution for this problem. These ICs enable circuit designers to reduce the computer size and to increase its speed and capability.

DETAILED DESCRIPTION OF ILLUSTRATIVE EMBODIMENTS OF THE INVENTION

Figure 1:
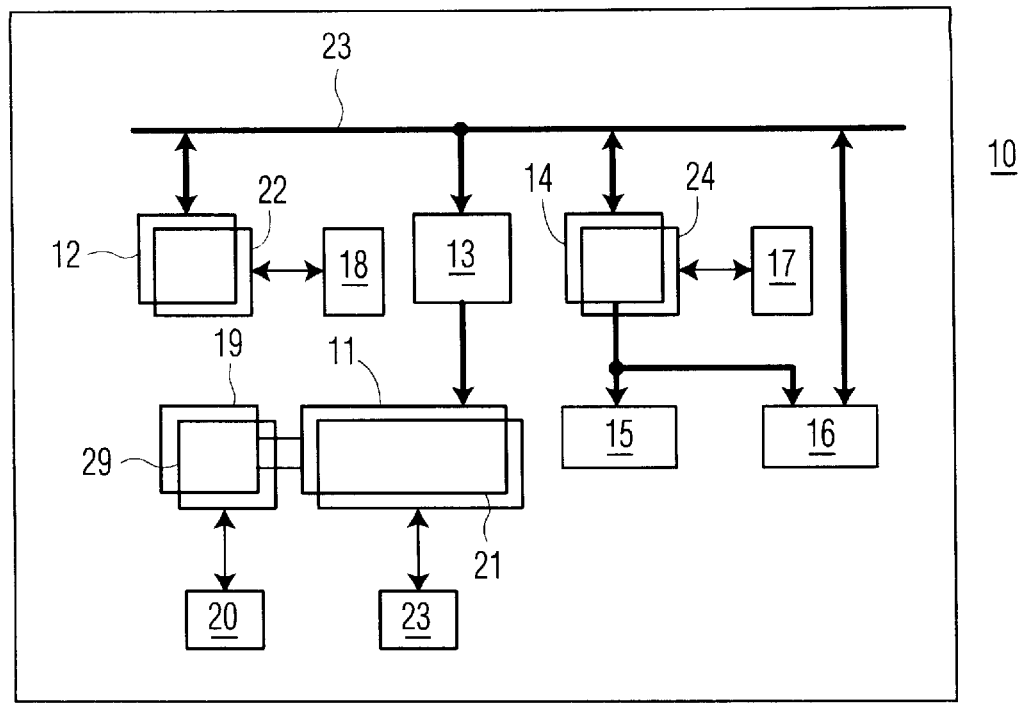
FIG. 1 is a schematic representation of an integrated circuit chip including thermoelectric coolers in accordance with the principles of this invention.

FIG. 1 represents an integrated circuit chip 10 having a plurality of functional areas 11, 12, 13 - - - 21 cooperative via, for example, internal data BUS 23 to perform prescribed functions such as that of a microprocessor or a digital signal processor. Thus, area 11 may comprise a timing and control area, area 12 may comprise an arithmetic logic unit, area 14 may comprise a register array and area 15 may comprise an address buffer.

As is also well understood, a timing and control circuit (11) is necessary for coordinating and timing the various functional areas. The timing circuit is one area of the chip which produces substantial heat during operation. The register array (14) and the arithmetic logic unit (12) also generate significant amounts of heat during operation. The crystal oscillator (19) requires a constant, stable temperature. In accordance with the principles of this invention, each of these components (11, 12, 14, and 19) is associated with a TEC represented as an extra block representation for each of those components and designated 21, 22, 24 and 29, respectively. Components 17 and 18 are controls for TECs 22 and 24 responsive to pulses occurring in the chip during normal operation. Components 20 and 23 are TEC controls for oscillator 19 and timing and control circuits 21, respectively, and are responsive to temperature sensors. The basic chip representation is that of an intel 8085 microprocessor to which the components 21, 22, 24, 29, 17, 18, 20 and 21 have been added in accordance with the principles of this invention.

Figure 2:
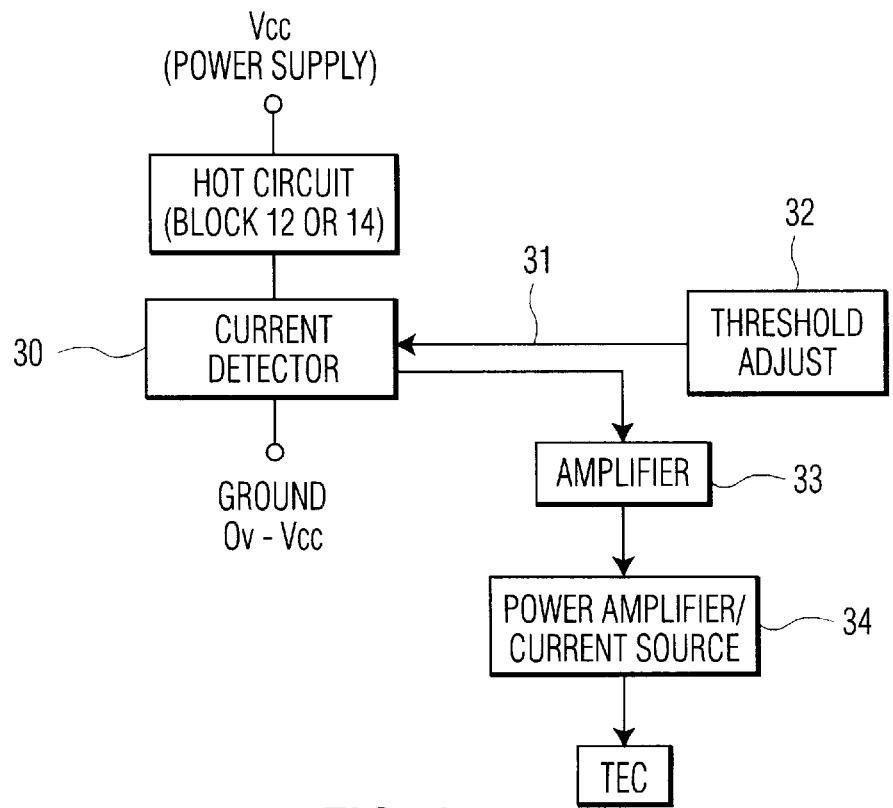
FIGS. 2 and 3 are block diagrams of the control circuits for the thermoelectric coolers of FIG. 1.

FIG. 2 is a block diagram of the operation of TEC 22 or TEC 24 responsive to current pulses applied to components 12 or 14, respectively, during operation of the microprocessor represented in FIG. 1. The each TEC (control circuit 17 and 18) includes a current detector represented by block 30 which is shown connected to a threshold adjust circuit by arrow 31. The threshold adjust circuit is represented by block 32.

The output of detector 30 is connected to amplifier 33. Amplifier 33, in turn is connected to a power amplifier/current source 34, the output of which is connected to the associated TEC (22 or 24). A feedback ammeter and a feedback ammeter with selectable voltage gain, either of which is suitable for use in the chip of FIG. 1 are described on page 38 of "low level" measurements, 1984, from Keithley Instruments, Inc., revised 3d edition.

Figure 3:
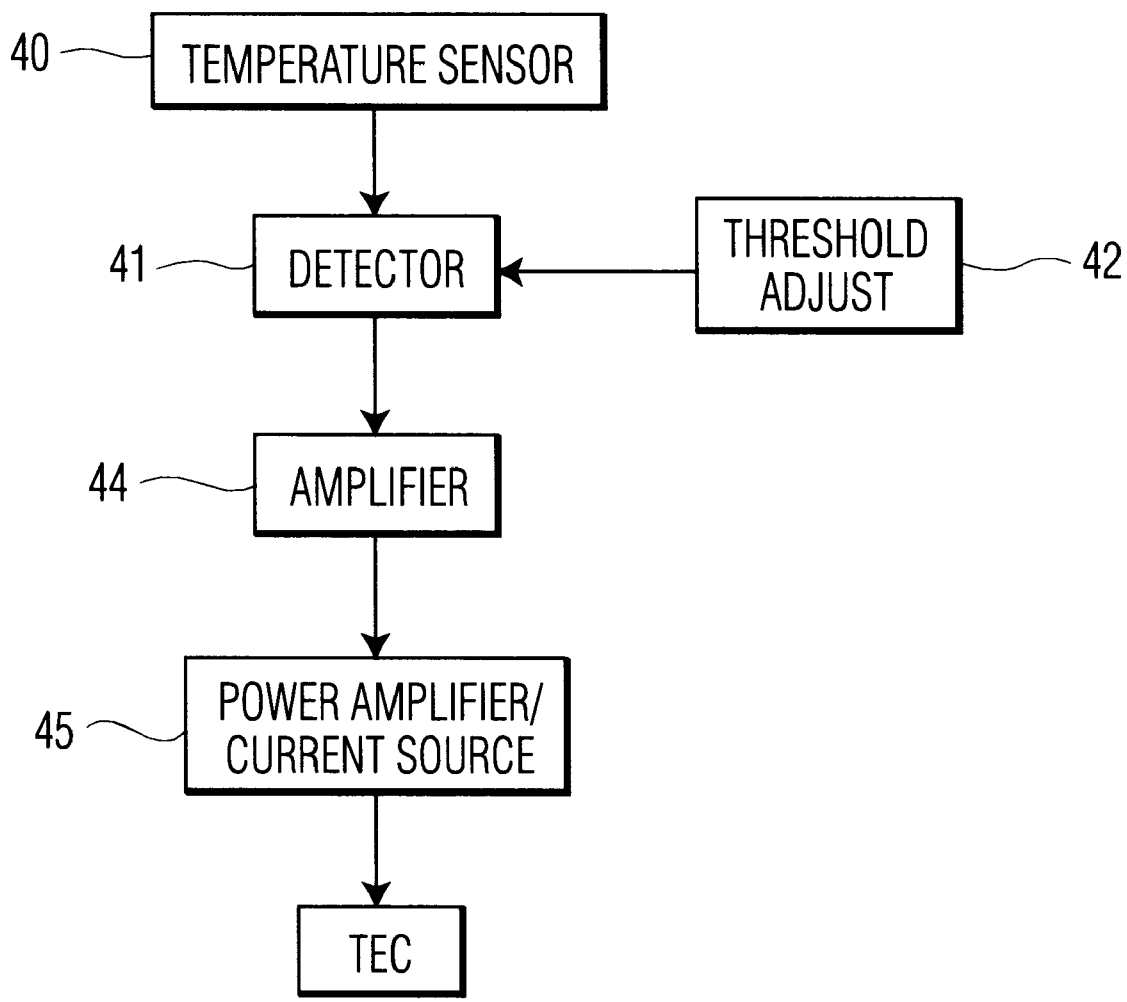

FIG. 3 is a block diagram of the operation of TEC circuit controls 23 and 20 for TECs 21 and 29 respectively. Each of controls 20 or 23 includes a temperature sensor as indicated by block 40 in FIG. 3. Such a sensor may comprise a thermister as is well known. The output of the thermistor is connected to the input of a detector represented by block 41. A threshold adjust circuit 42 is connected to detector 41 to preset the temperature level which when exceeded results in the activation of the TEC. The output of the detector is connected to the input of an amplifier represented by block 44 in FIG. 4. The output of amplifier 44 is connected to power amplifier/current source 45. The output of source 45 is connected to the TEC (22 or 24) for supplying current to the TEC when the temperature threshold as set by 42 is detected by detector 41. The illustrative embodiment contemplates a current of a polarity to cool the associated component of the chip. It should be apparent to one skilled in the art that a current of an opposite polarity may be used to heat a component if it is determined that stable operation temperature is more important as is the case with oscillator 19.

Figure 4:
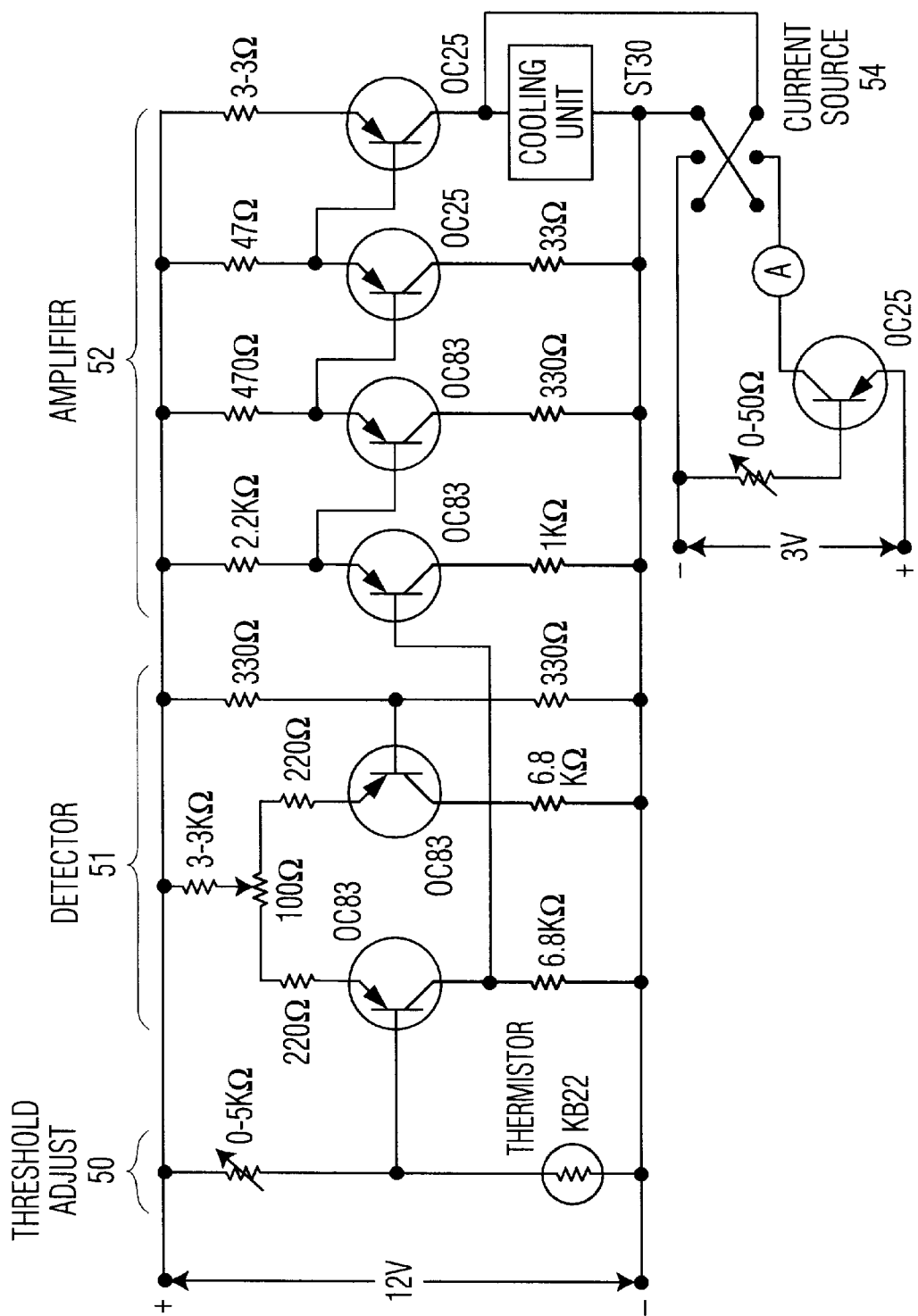
FIG. 4 is a circuit schematics of an illustrative control circuit for the TECs of FIG. 1.

FIG. 4 shows a circuit diagram for a thermoelectric cooler comprising a threshold adjust portion 50, a detector portion 51, an amplifier portion 52 and a current source 54. Such a circuit is merely illustrative of such well known suitable circuits to this end. The circuit is described on page 229 of "Thermoelectric Refrigeration" published 1964 by Plenum Press. A full description of the Intel 8085 microprocessor as well as the pulse diagram for the operation of the microprocessor is presented on pages 485, 486, 487 and 488 of "The Art of Electronics", by P. Horowitz and W. Hill, Cambridge University Press, 1930.

Figure 5:
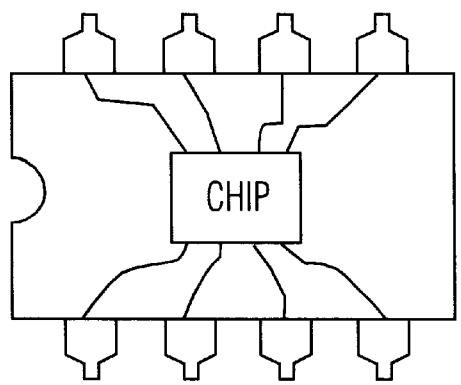
FIGS. 5 and 6 are top and perspective views of a chip as shown in FIG. 1 ready for encapsulation and encapsulated respectively.
Figure 6:
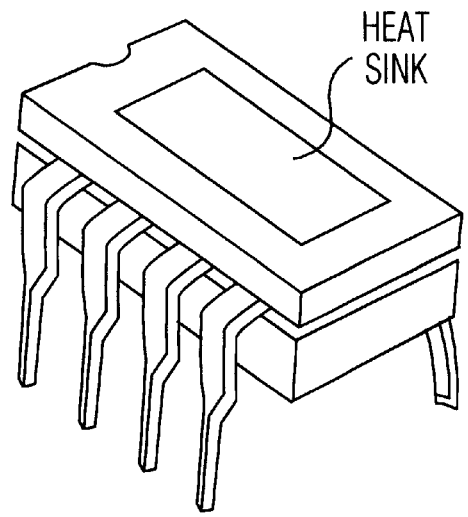

FIGS. 5 and 6 show a top view of the microprocessor chip 10 of FIG. 1 on a substrate ready for encapsulation. The pinouts for a plurality of components are shown. In this embodiment, the chip is encapsulated as shown in FIG. 6 and a heat sink is abutted against the completed encapsulation in conventional manner. In this embodiment, the chip is encapsulated as shown in FIG. 6 and a heat sink is abutted against the completed encapsulation in conventional manner.

If TEC components are not formed as part of the integrated circuit fabrication as discussed in connection with FIGS. 1–4, a TEC may be abutted against a microprocessor prior to the completion of the encapsulation. Such an arrangement, prior to encapsulation is illustrated in FIG. 7.

Figure 7:
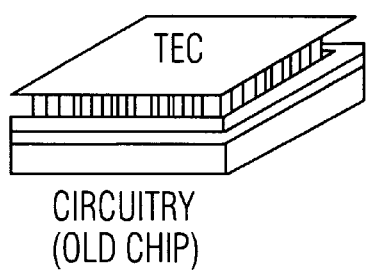
FIG. 7 is a projection view of a semiconductor chip absent on-board TEC components but including an abutting TEC prior to encapsulation.

It is clear that the arrangement illustrated in FIG. 7 is not as beneficial as are arrangements where TECs are formed at the integrated circuit hot spots. But such arrangements do offer advantages over the prior art because they locate a TEC within the integrated circuit package.

In embodiments where the TECs are formed as part of the integrated circuit fabrication process, only negligible space on the chip is occupied by each TEC. But temperature of local hot spots can be controlled to exacting specifications which allows a significant increase in component packing density.

What is claimed is:

1. A solid state chip, said chip including means for defining in said chip a plurality of functional regions, at least a first of said regions being operative for generating beat during operation, said chip also having defined therein a thermoelectric cooler, said cooler being positioned with respect to said first region for removing heat from said first region.

2. A chip as in claim 1 wherein said cooler is responsive to pulses applied to said first region during operation to remove heat from said region.

3. A chip as in claim 1 wherein said chip also includes a sensor at said first region, said cooler being responsive to a signal from said sensor for removing heat from said first region.

4. A solid state chip, said chip including means for defining in said chip a plurality of functional areas at least a first of said regions being operative for generating heat during operation said chip including a thermoelectric cooler, said cooler being positioned with respect to said first region for removing heat from said region, said chip having at least first and second regions, said chip also including first and second coolers coupled to said first and second regions respectively for removing heat from said regions.

5. A chip as in claim 4 wherein said first and second coolers are responsive to pulses applied to said first and second regions respectively for removing heat.

6. A chip as in claim 4 also including first and second sensors coupled to said first and second regions respectively, said first and second cooler being responsive to signals from the associated one of said sensors for removing heat.

7. A chip as in claim 5 also including third and fourth regions, said chip also including first and second sensors coupled to said third and fourth regions respectively, said chip also including third and fourth coolers coupled to said third and fourth regions respectively, said third and fourth coolers being responsive to said first and second sensors respectively for removing heat from said third and fourth regions.

8. A solid state chip including a plurality of functional regions, said chip including a plurality of thermoelectric coolers, each of said coolers being coupled to a different one of said functional regions and being operative to control the temperature of the associated region.

9. A solid state chip as in claim 8 wherein at least one of said functional regions includes a temperature sensor and the associated one of said coolers is responsive to said sensor.

10. A solid state chip as in claim 8 wherein each of said plurality of coolers is responsive to pulses applied to the associated one of said functional areas for controlling the temperature thereof.

11. A solid state chip as in claim 8 wherein said functional regions and coolers are defined in a single semiconductor chip.

* * * * *

UNITED STATES PATENT AND TRADEMARK OFFICE
CERTIFICATE OF CORRECTION

PATENT NO. : 6,250,085 B1
DATED : June 26, 2001
INVENTOR(S) : Tousson

It is certified that error appears in the above-identified patent and that said Letters Patent is hereby corrected as shown below:

Column 4,
Lines 10-17, reads:
"What is claimed is:
1. A solid state chip, said chip including means for defining in said chip a plurality of functional regions, at least a first of said regions being operative for generating beat during operation, said chip also having defined therein a thermoelectric cooler, said cooler being positioned with respect to said first region for removing heat from said first region."
should read:
-- What is claimed is:
1. A solid state chip, said chip including means for defining in said chip a plurality of functional regions, at least a first of said regions being operative for generating heat during operation, said chip also having defined therein a thermoelectric cooler, said cooler being positioned with respect to said first region for removing heat from said *first region.* --.

Signed and Sealed this

Twenty-eighth Day of February, 2006

JON W. DUDAS
*Director of the United States Patent and Trademark Office*